(12) United States Patent
Li et al.

(10) Patent No.: US 9,449,822 B2
(45) Date of Patent: Sep. 20, 2016

(54) METHOD OF FORMING SEMICONDUCTOR STRUCTURES WITH CONTACT HOLES

(75) Inventors: Wai-Kin Li, Hopewell Junction, NY (US); Wu-Song Huang, Hopewell Junction, NY (US); Joy Cheng, San Jose, CA (US); Kuang-Jung Chen, Hopewell Junction, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 869 days.

(21) Appl. No.: 12/846,020

(22) Filed: Jul. 29, 2010

(65) Prior Publication Data

US 2012/0028476 A1  Feb. 2, 2012

(51) Int. Cl.
*H01L 21/033* (2006.01)

(52) U.S. Cl.
CPC ....... *H01L 21/0337* (2013.01); *H01L 21/0338* (2013.01)

(58) Field of Classification Search
CPC .......... H01L 51/0072; H01L 51/0085; H01L 51/0074; H01L 51/5016; H01L 51/0054
USPC ....................................... 438/780
See application file for complete search history.

(56) References Cited

U.S. PATENT DOCUMENTS

| | | | |
|---|---|---|---|
| 7,008,733 B2 | 3/2006 | Lai | |
| 7,022,438 B2 | 4/2006 | Kim | |
| 7,300,746 B2 | 11/2007 | Kim | |
| 7,521,094 B1 | 4/2009 | Cheng et al. | |
| 7,556,891 B2 * | 7/2009 | Tan et al. | 430/5 |
| 7,572,572 B2 | 8/2009 | Wells | |
| 7,605,081 B2 | 10/2009 | Yang et al. | |
| 8,208,294 B2 * | 6/2012 | Happ et al. | 365/163 |
| 2007/0293041 A1 * | 12/2007 | Yang et al. | 438/637 |
| 2008/0227295 A1 | 9/2008 | Chen | |

* cited by examiner

*Primary Examiner* — Tony Tran
(74) *Attorney, Agent, or Firm* — Hoffman Warnick LLC; Yuanmin Cai

(57) ABSTRACT

Embodiments of the present invention provide a method of forming a semiconductor structure. The method includes forming a set of shapes on top of a substrate; applying a layer of copolymer covering the substrate; causing the copolymer to form a plurality of cylindrical blocks both inside and outside the shapes; forming a pattern of contact holes from the plurality of cylindrical blocks; and transferring the pattern of contact holes to the substrate to form the semiconductor structure. In one embodiment, the shapes are rings and forming the set of shapes includes forming a set of rings that are equally and squarely spaced. In another embodiment, causing the copolymer to form the plurality of cylindrical blocks includes forming only one cylindrical block inside each of the rings and only one cylindrical block outside every four (4) squarely neighboring rings.

30 Claims, 7 Drawing Sheets

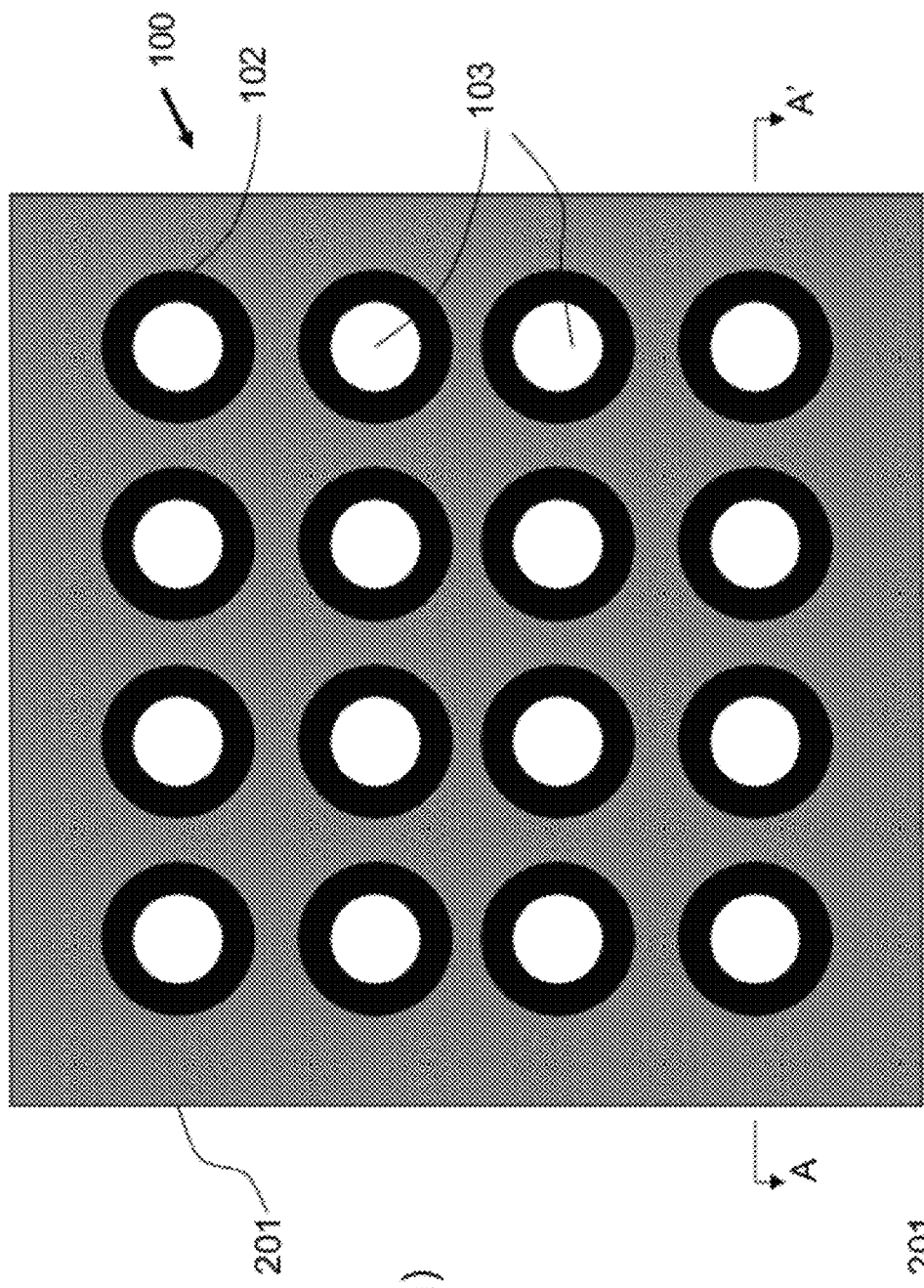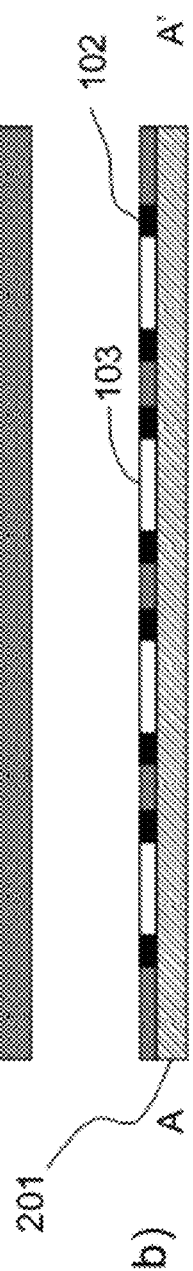
FIG. 3(a)
FIG. 3(b)

METHOD OF FORMING SEMICONDUCTOR STRUCTURES WITH CONTACT HOLES

FIELD OF THE INVENTION

The present invention relates generally to the field of semiconductor device manufacturing and in particular relates to method of forming semiconductor structures with contact holes.

BACKGROUND OF THE INVENTION

Current state-of-art lithographic tools are normally capable of providing lithographic patterns, such as contact holes or contact openings, with a resolution of not less than approximately 100 nm in diameter. However, at least in some of the currently available integrated chips, such large size of contact openings is considered as one of the major contributing factors to the undesirable low device density. In the meantime, the ever demanding scaling of semiconductor devices means that future CMOS technology will need to provide sub-50 nm metal contacts for connecting CMOS devices, such as field effect transistors (FETs), to back-end-of-line (BEOL) wiring. It is clear that there is a need for reducing the size of contact openings to a level below resolutions of current and even future-developed lithographic tools, i.e., there is a need for sub-lithography feature patterning technique.

It has been known in the art that certain materials are capable of spontaneously organizing into ordered patterns without the need of human intervention. Such materials are typically known, and are referred to hereinafter, as self-assembling materials. Examples of materials capable of self-assembly range from snowflakes to seashells to sand dunes, all of which may form some type of regular or ordered patterns in response to an existing external or surrounding condition, such as whether the material is in a free or unconstrained space or is bound by a unique boundary or external structure.

Among various self-assembling materials, self-assembling block copolymers are capable of self-organizing into nanometer-scale patterns and therefore are generally considered as particularly promising for enabling future advancement in the semiconductor technology. Each self-assembling block copolymer system typically contains two or more different polymeric block components that are immiscible with one another. Under suitable conditions, the two or more immiscible polymeric block components may separate into two or more different phases on a nanometer scale and form ordered patterns of isolated nano-sized structural units.

Such ordered patterns of structural units formed by self-assembling block copolymers may be used for fabricating nano-scale structural units in semiconductor, optical, and/or magnetic devices. In particular, dimensions of the structural units so formed are typically in the range of 10 nm to 40 nm, which are sub-lithographic (i.e., below the resolutions of current lithographic tools). Furthermore, the self-assembling block copolymers are compatible with processes generally used for conventional semiconductor, optical, and/or magnetic devices. Thus, the ordered patterns of nano-sized structural units formed by such block copolymers, if arranged properly, may be integrated into semiconductor, optical, and magnetic devices where a large, ordered array of repeating structural units are required.

Generally, CMOS technology requires precise placement or registration of individual structural units for formation of metal lines and vias in the wiring levels. The large, ordered array of repeating structural units formed by self-assembling block copolymers could not be directly used in CMOS devices, due to lack of alignment or registration of positions of the individual structural units.

SUMMARY OF EMBODIMENTS OF THE INVENTION

Embodiments of the present invention provide a method of forming a semiconductor structure. The method includes forming a set of shapes on top of a substrate; applying a layer of copolymer covering the substrate; causing the copolymer to form a plurality of cylindrical blocks both inside and outside the shapes; forming a pattern of contact holes from the plurality of cylindrical blocks; and transferring the pattern of contact holes to the substrate to form the semiconductor structure.

In one embodiment, the shapes are rings and forming the set of shapes includes forming a set of rings that are equally and squarely spaced.

In another embodiment, causing the copolymer to form the plurality of cylindrical blocks includes forming only one cylindrical block inside each of the rings and only one cylindrical block outside every four (4) squarely neighboring rings.

In one embodiment, the copolymer has a property of forming cylindrical blocks separated by a distance Cp in an unconstrained space, and wherein causing the copolymer to form only one cylindrical block inside each of the rings includes forming the rings to have an inner diameter size larger than Cp but less than 2×Cp, and causing the copolymer to form only one cylindrical block outside every four (4) squarely neighboring rings includes forming the rings to have a distance between two diagonally neighboring rings larger than Cp but less than 2×Cp.

In one demonstrative example, the copolymer is polystyrene-block-polymethylmethacrylate (PS-b-PMMA) and in an unconstrained space forms cylindrical blocks separated by Cp, and wherein the Cp is designed according to an inner diameter size of the rings and a distance between two diagonally neighboring rings, by adjusting a ratio of PS versus PMMA in weight.

In one embodiment, the method further includes forming a set of openings in a photo-resist material coated on the substrate; applying a layer of cross-link coating material covering the set of openings; causing the cross-link coating material to form the set of shapes along sidewalls of the set of openings; and removing the photo-resist material from the substrate.

In a further embodiment, the method further includes exposing the cross-link coating material to a heated environment to cause the cross-link coating material to react with the sidewalls of the set of openings in forming the set of shapes, and removing un-reacted cross-link coating material through a developing process.

BRIEF DESCRIPTION OF THE DRAWINGS

The present invention will be understood and appreciated more fully from the following detailed description of preferred embodiments, taken in conjunction with the accompanying drawings of which:

FIG. 3(a) and FIG. 3(b) are demonstrative illustrations of top and cross-sectional views of the semiconductor structure during a process of manufacturing thereof, following the step illustrated in FIG. 2, according to an embodiment of the invention;

Figures 1A, 1B:
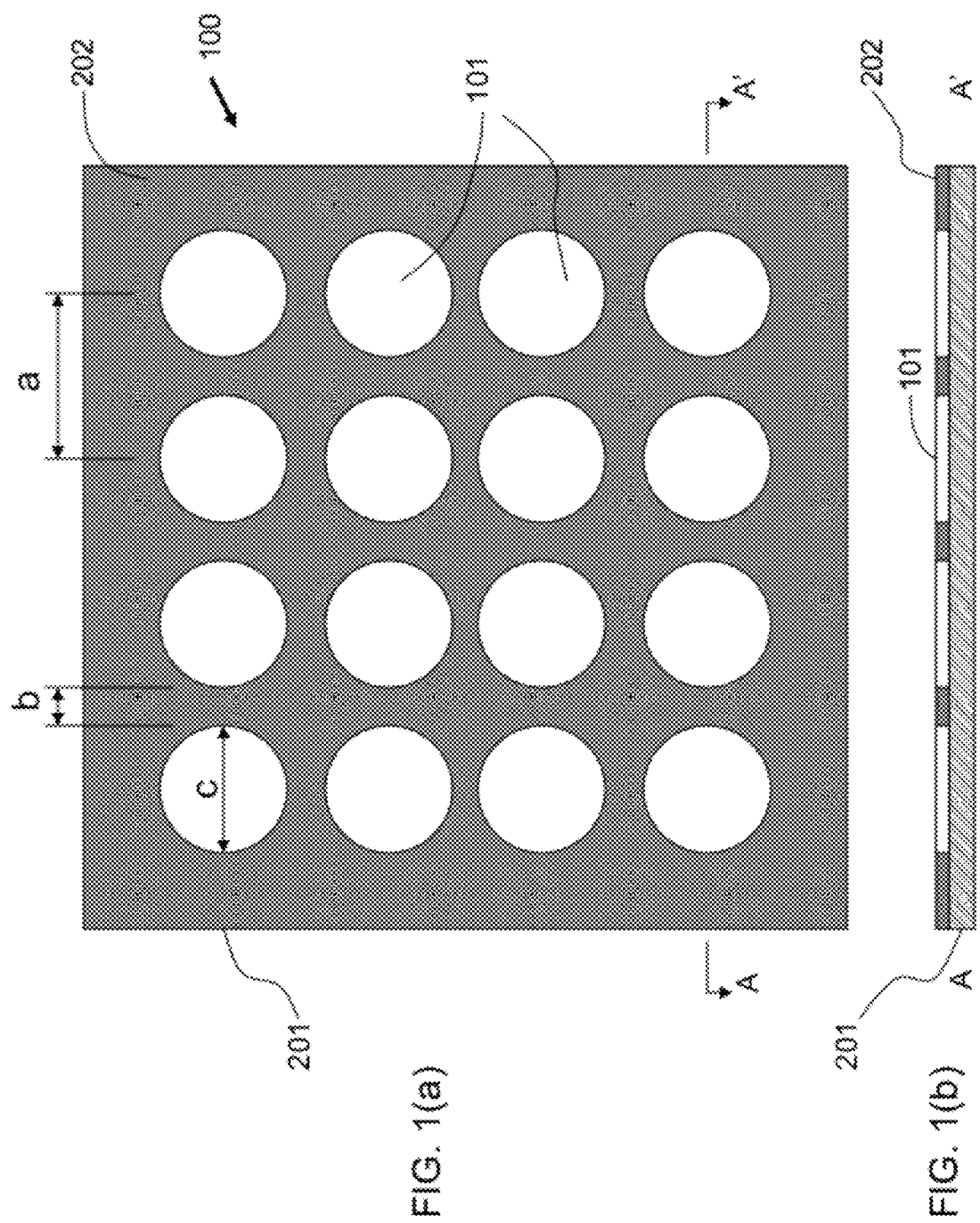
FIG. 1(a) and FIG. 1(b) are demonstrative illustrations of top and cross-sectional views of a semiconductor structure during a process of manufacturing thereof according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1(a) and FIG. 1(b) are demonstrative illustrations of top and cross-sectional views of a semiconductor structure during a process of manufacturing thereof according to an embodiment of the present invention. In the below description, FIG. 1(a) and FIG. 1(b) may be individually or collectively referred to as FIG. 1 and the same strategy of referencing may be used for other figures as well. In making resist pattern 100 illustrated in FIG. 1, embodiment of the present invention provides a method that includes forming a set of openings 101 which may be, for example, a first group of contact holes in a photo-resist material 202 that is coated on a substrate 201. Among many possible shapes, openings 101 may be in a circular shape as shown in FIG. 1, an elliptical shape, or a shape formed from two or more overlapped circles. Substrate 201 may be, for example, silicon, oxide, nitride, or any other suitable semiconductor or non-semiconductor materials whereupon and/or wherein the semiconductor structure is formed. The first group of contact holes 101 may have a density, referred to herein as a first density, measured or defined by the number of contact holes or openings within a predetermined or unit area. Openings or contact holes 101 of first density may not be openings or contact holes of a high density and may be, for example, openings or contact holes of a medium density. Here, the word "high" and "medium" are used in their relative terms. For example, first density of contact holes 101 is referred to as "medium" density which is measured relative to and in comparison with to a second density of a second group of contact holes, such as contact holes 106 and 107 illustrated in FIG. 6. The second group of contact holes in FIG. 6 is referred to as contact holes of a high density, which is formed according to embodiments of the present invention being described below in more details.

The set of openings or first group of contact holes 101 may be uniformly and squarely spaced. In other words, centers of contact holes 101 may situate at corners of a set of interconnected squares. Openings or contact holes 101 may be separated from each other by a distance "a", as being measured for example from center to center of the contact holes. As a non-limiting example, distance "a" may have a nominal value around 100 nm. Each contact hole may have a diameter "c" of a certain percentage of distance "a", for example 70 percent, and in the present instance may be around 70 nm. Thus, when being measured from their neighboring edges, any two vertically or horizontally neighboring contact holes may be separated by a distance "b" of nominally around 30 nm while any two diagonally neighboring contact holes may be separated by a distance of nominally around 71 nm, both values may be readily estimated and/or calculated from the geometry shape of contact hole arrangement in resist pattern 100 shown in FIG. 1(a).

It shall be noted that embodiments of present invention are not limited to the above specific size of contact holes and distances among them, and may be applied to other different contact hole sizes and spacing arrangement. For example, the above specific size of contact holes may be suitable for the formation of via used in the 22 nm technology. Other technologies may use different sizes of contact holes and/or different distances between contact holes.

Figures 2A, 2B:
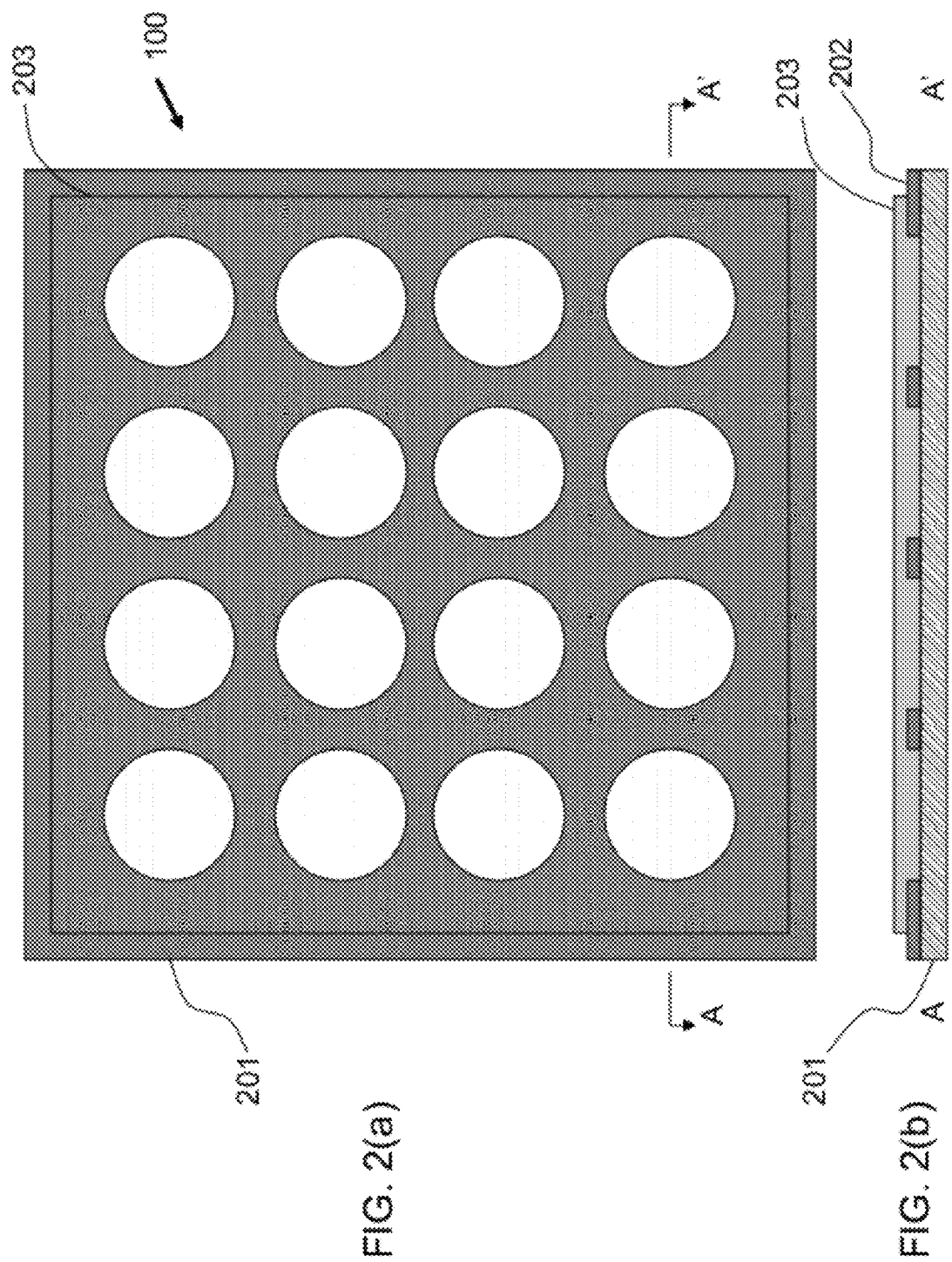
FIG. 2(a) and FIG. 2(b) are demonstrative illustrations of top and cross-sectional views of the semiconductor structure during a process of manufacturing thereof, following the step illustrated in FIG. 1, according to an embodiment of the invention.

FIG. 2(a) and FIG. 2(b) are demonstrative illustrations of top and cross-sectional views of the semiconductor structure during a process of manufacturing thereof, following the step illustrated in FIG. 1, according to an embodiment of the invention. More specifically, a cross-link coating material (CLK) 203 may be applied on top of, and thereby covering, the set of openings 101 or first group of contact holes 101, as well as photo-resist material 202 surrounding contact holes 101. The application of CLK material 203 may be through a spin-on process or any other existing or future developed coating applying processes. In FIG. 2, for illustration purpose, the edge of photo-resist layer 202 is illustrated as being un-covered by CLK 203 in order to show photo-resist layer 202 underneath CLK layer 203. The same way of illustration may be used for other figures as well. Suitable cross-link coating material 203 may include, for example, polymers that contain cross-linking site and/or polymer matrix with cross-linking compounds being added. Other types of materials may be used as well as long as such materials exhibit properties, as being described below in more details, that are similar to the above listed CLK materials. In fact, selection of CLK material may also be affected by thickness requirement of a cross-link layer to be formed inside openings or contact holes 101, in order to meet certain dimension requirement of open and closed regions, as being discussed below in more details.

FIG. 3(a) and FIG. 3(b) are demonstrative illustrations of top and cross-sectional views of the semiconductor structure during a process of manufacturing thereof, following the step illustrated in FIG. 2, according to an embodiment of the invention. For example CLK material 203 may be subjected to a heated environment such as a baking process. During the baking process, embodiment of the present invention may include causing the CLK material 203 to react with sidewalls of the set of openings or contact holes 101 thereby forming a set of shapes 102 or a cross-linked layer along sidewalls of contact holes 101. The baking process may be followed by a developing process such that the rest of un-reacted CLK material 203 may be removed, leaving only cross-linked layer 102 stay next to the sidewalls of openings 101. Shapes 102 may be any shapes such as cycles, ovals, or even square or rectangular shapes although in FIG. 3 they are shown as cycles as an example. Depending upon properties of CLK material 203, in one embodiment, the set of shapes or cross-linked layer 102 may have a thickness, measured laterally as thickness of the rings formed by cross-linked layer 102, of nominally around 10 nm, which results in a total reduction of diameter of the first group of contact holes 101 by about 20 nm. In other words, a group of modified contact holes 103 with a diameter of nominally around 50 nm may be formed by cross-linked layer 102.

Figures 4A, 4B:
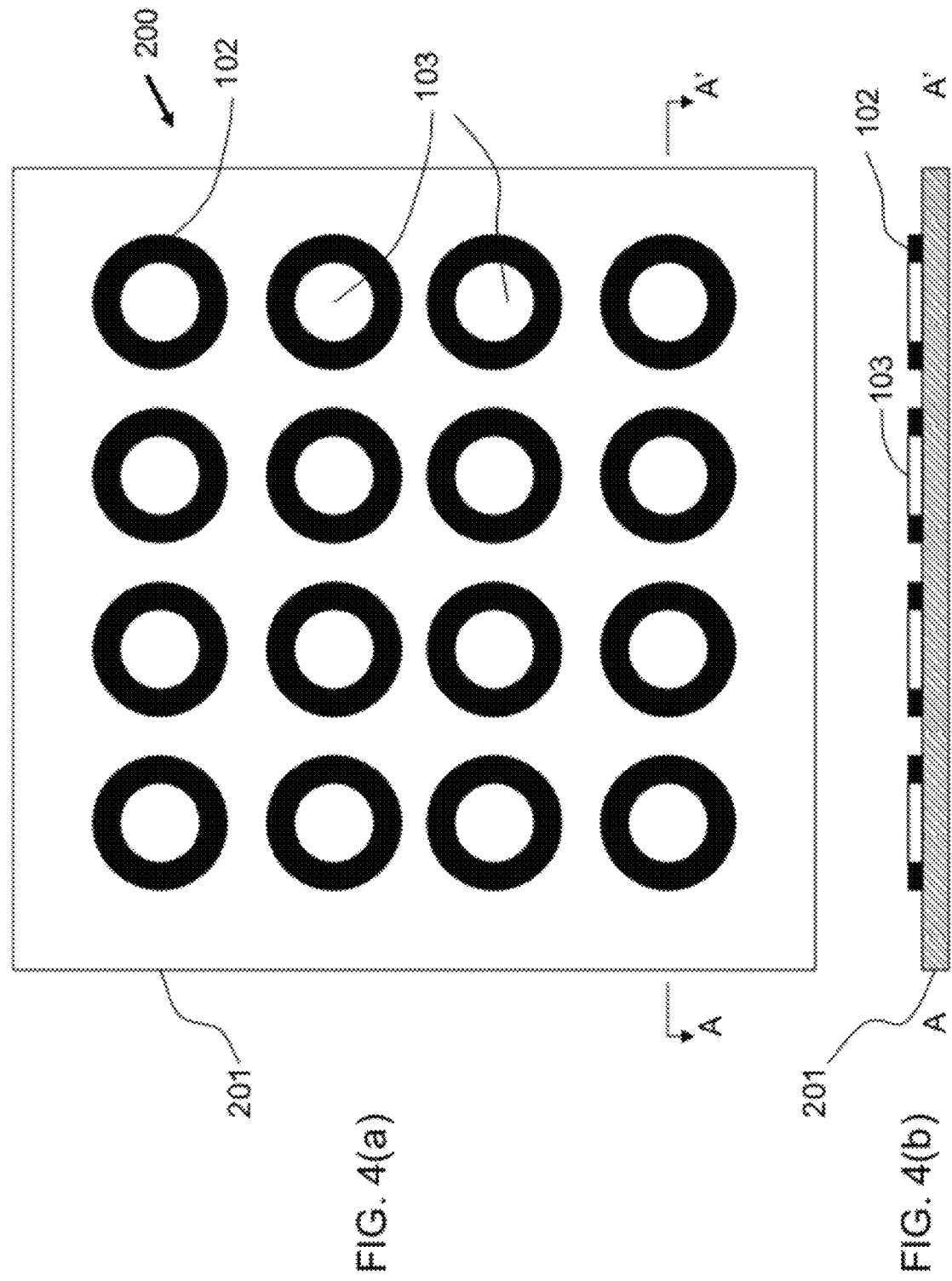
FIG. 4(a) and FIG. 4(b) are demonstrative illustrations of top and cross-sectional views of the semiconductor structure during a process of manufacturing thereof, following the step illustrated in FIG. 3, according to an embodiment of the invention.

FIG. 4(a) and FIG. 4(b) are demonstrative illustrations of top and cross-sectional views of the semiconductor structure during a process of manufacturing thereof, following the step illustrated in FIG. 3, according to an embodiment of the invention. After forming cross-linked layer 102 and removing remaining un-reacted CLK material 203 from substrate 201, substrate 201 may be subjected to a second round of baking and developing process. During this process, photoresist material 202 may be removed from substrate 201, leaving only the set of shapes or cross-linked layer 102 on substrate 201, forming a cross-link pattern 200. In effect, cross-linked layer 102 is effectively a set of cross-linked rings 102 (and therefore may be referred to hereinafter as a set of cross-linked rings from time to time) and, in one embodiment each ring has an inner diameter of about 50 nm; an outer diameter of about 70 nm; and a thickness of about 10 nm.

Figures 5A, 5B:
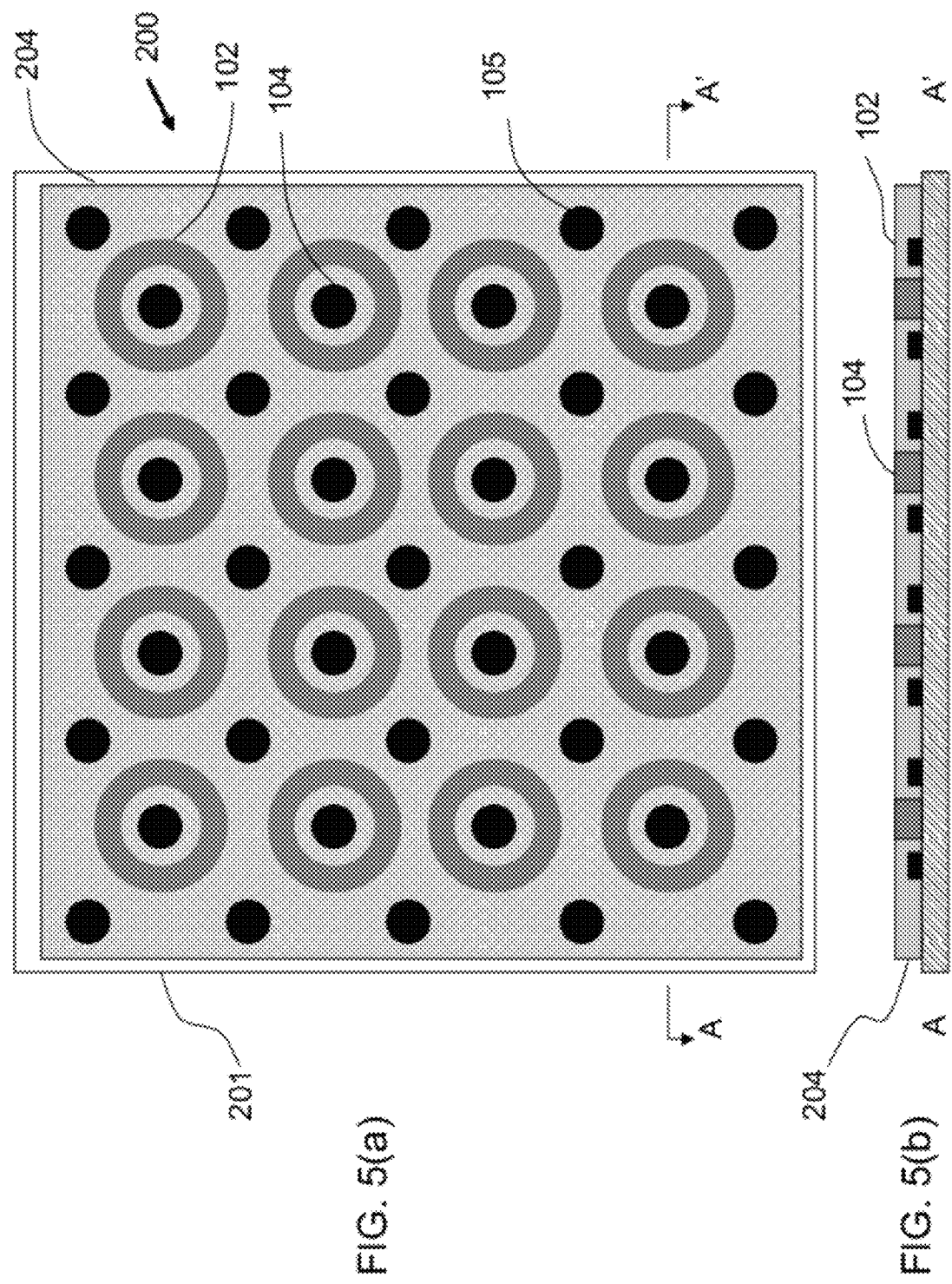
FIG. 5(a) and FIG. 5(b) are demonstrative illustrations of top and cross-sectional views of the semiconductor structure during a process of manufacturing thereof, following the step illustrated in FIG. 4, according to an embodiment of the invention.

FIG. 5(a) and FIG. 5(b) are demonstrative illustrations of top and cross-sectional views of the semiconductor structure during a process of manufacturing thereof, following the step illustrated in FIG. 4, according to an embodiment of the invention. With the reduced size of modified contact holes 103 formed by cross-linked rings 102 in cross-link pattern 200, a layer of copolymer material 204, for example, diblock copolymer polystyrene-block-polymethylmethacrylate (PS-b-PMMA or PMMA+PS) may be applied or coated onto substrate 201 covering substrate 201 and generally also covers the set of cross-linked rings 102. In addition to diblock copolymer of PMMA+PS, other triblock or tetrablock copolymer may be used as well. For example, other suitable block copolymers that may be used in the present invention include, but are not limited to, polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The application of coating of diblock copolymer PMMA+PS 204 may be through a spin-on process or any other suitable processes or techniques. Diblock copolymer PMMA+PS may have a PS versus PMMA weight ratio ranging from about 80:20 to about 60:40, which may be adjusted based upon for example size of cross-linked rings 102 and size of area surrounding cross-linked rings 102. Following the application, embodiment of the invention includes subjecting the PMMA+PS copolymer material 204 to an annealing process for phase separation, which causes PMMA and PS to segregate and form multiple cylindrical blocks both inside and outside shapes or cross-linked rings 102. The annealing process may be conducted at a temperature below 250 degree C., preferably around 150 to 200 degree C., and may last for a duration of around 300 seconds or 5 minutes.

Figure 7B:
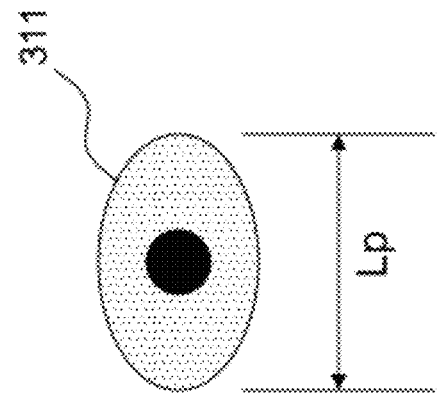
FIG. 7(a) and FIG. 7(b) are demonstrative illustrations of boundary dimension conditions under which copolymer may form one or more cylindrical blocks.
Figure 7A:
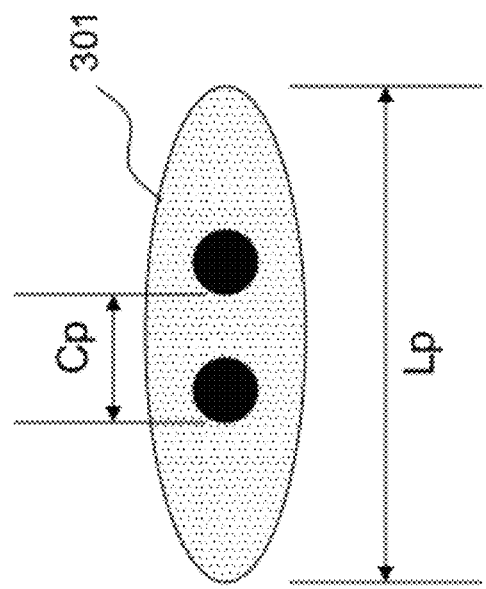

Reference is now quickly made to FIG. 7(a) and FIG. 7(b), which demonstratively illustrate boundary dimension conditions under which copolymer may form one or more cylindrical blocks. It is well known in the art that copolymer, when being applied to a surface, normally forms certain patterns of cylindrical blocks and such patterns may be affected and/or influenced by properties of the copolymer, as well as shape and/or size of their surrounding structures and/or boundary conditions.

For example, cylindrical blocks are normally formed by a copolymer to have a distance Cp among themselves under an unconstrained space or free space. Distance Cp is normally determined by properties of the copolymer such as a weight ratio of the polymeric block components inside the copolymer. In the case of polystyrene-block-polymethylmethacrylate, it is the weight ratio, or equivalently a period ratio, between PS and PMMA that determines distance Cp. When the period of PS has a fix ratio to the period of PMMA in diblock copolymer of PMMA+PS, under the condition that a surrounding structure 301, shown in FIG. 7(a), provides sufficient space Lp for the copolymer to form at least two cylindrical blocks, the two cylindrical blocks are normally formed to have a spacing Cp. For example, if Lp is equal or larger than two times Cp (Lp>=2×Cp), two cylindrical blocks may be formed as shown in FIG. 7(a). On the other hand, as shown in FIG. 7(b) when the surrounding structure 311 provides a space Lp that is larger than Cp but less than two times Cp (Cp<Lp<2×Cp), then one cylindrical block and only one cylindrical block may be formed inside structure 311. The one cylindrical block is generally formed symmetrically inside, or close to a center of, the structure. Moreover, size of the cylindrical block may be adjusted by adjusting the molecule weight of PMMA which forms the cylindrical block. According to one embodiment of the present invention, in general the size of contact holes to be formed in the semiconductor structure may be adjusted by designing or selecting the proper polymeric block component of the copolymer, such as PMMA in a PMMA+PS copolymer, to have a proper molecule weight. In principle, the shape of opening 101 in FIG. 1 is not limited to circles, and may have an elliptical shape 301 or 311 as shown in FIG. 7 or a shape of two or more overlapping circles, and such shapes may allow forming more than one diblock copolymer cylindrical blocks.

Reference is now made back to FIG. 5(a) and FIG. 5(b). In the regions covered by diblock copolymer 204 of PMMA+PS, for example, there are different types of spaces that may be suitable for forming copolymer cylindrical blocks. For example, there are enclosed regions, the region enclosed by cross-linked rings 102, with a diameter of nominally around 50 nm. According to one embodiment, weight ratio of PS versus PMMA may be adjusted between 80:20 and 60:40 such that Cp of diblock copolymer PMMA+PS is less than 50 nm, for example around 40 nm. Since the space 50 nm inside the enclosed region is larger than Cp (of 40 nm) but less than two times Cp (of 80 nm), one single cylindrical block 104 may be formed inside. Also, there are open regions such as, for example, regions in the middle of four neighboring cross-linked rings 102 that have a space of nominally around 71 nm (measured diagonally). Similarly, since this space is larger than Cp but less than two times Cp, one, and only one, cylindrical block 105 may be formed there. Both cylindrical block 104 and 105 may be formed approximately in the center of these spaces as being illustratively shown in FIG. 5.

It is to be appreciated that embodiments of the present invention are not limited to the above specific sizes and dimensions. Other copolymer materials and corresponding space dimensions may be used as well. For example, embodiment of the present invention may be applied to any situations where both the open and closed regions, as being defined and described above, have a space that is larger than Cp but less than two times Cp of any particular copolymer material used. This may include making the proper selection of a cross-link coating material CLK 203 for the adjustment of thickness of cross-linked layer 102, as shown in FIG. 4, and/or adjusting Cp by selecting a proper weight ratio between PS and PMMA in a PMMA+PS copolymer, or the polymeric block components if a different diblock, triblock, or tetrablock copolymer is used.

Figures 6A, 6B:
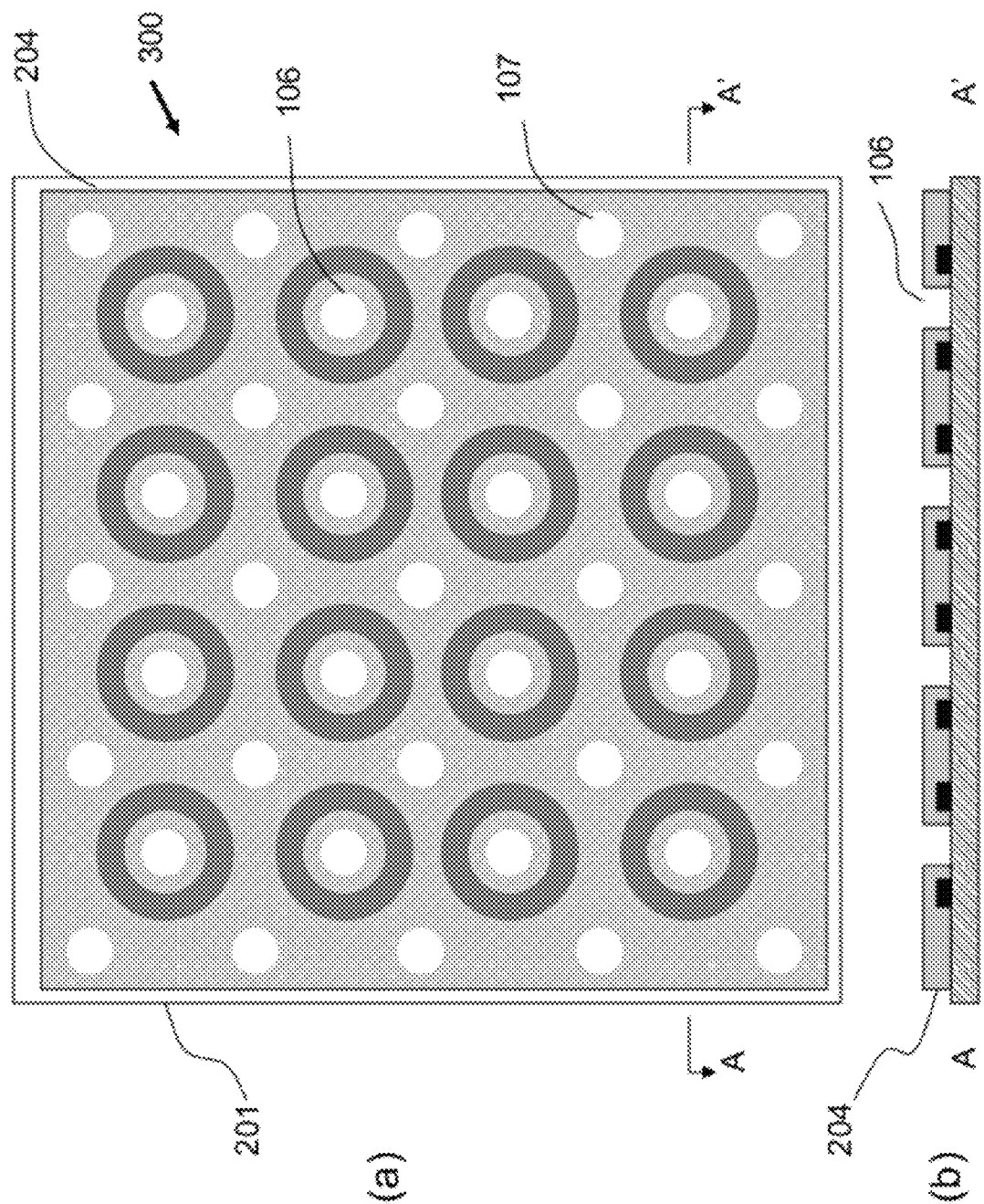
FIG. 6(a) and FIG. 6(b) are demonstrative illustrations of top and cross-sectional views of the semiconductor structure during a process of manufacturing thereof, following the step illustrated in FIG. 5, according to an embodiment of the invention.

FIG. 6(a) and FIG. 6(b) are demonstrative illustrations of top and cross-sectional views of the semiconductor structure during a process of manufacturing thereof, following the step illustrated in FIG. 5, according to an embodiment of the present invention. More specifically, following the formation of cylindrical blocks 104 and 105 through annealing, suitable solvent such as, for example, isopropyl alcohol (IPA) may be used to rinse away copolymer cylindrical blocks 104 and 105, thereby creating a group of openings 106 and 107 inside diblock copolymer 204. Openings 106 and 107 collectively form a second group of contact holes 106 and 107, representing a copolymer pattern 300 of contact holes. Cross-linked rings 102 of cross-link pattern 200 may be covered by the diblock copolymer 204 and in fact may not even be visible. Copolymer pattern 300 shown in FIG. 6 has a second density of contact holes 106 and 107 that is double the density of contact holes 102 shown in FIG. 1. Contact holes 106 and 107 of copolymer pattern 300 may subsequently be transferred, through a photolithographic process, into substrate 201 to form a patterned semiconductor structure.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming a semiconductor structure, comprising:
   forming a set of shapes on top of a substrate;
   applying a layer of copolymer covering said substrate;
   causing said copolymer to form a plurality of cylindrical blocks both inside and outside said set of shapes, said cylindrical blocks inside said set of shapes being same in both shape and size as said cylindrical blocks outside said set of shapes;
   forming a pattern of contact holes from said plurality of cylindrical blocks; and
   transferring said pattern of contact holes to said substrate to form said semiconductor structure,
   wherein said set of shapes is a set of rings each having an inner sidewall and an outer sidewall and forming said set of shapes comprises forming said set of rings to be equally spaced along a first and a second direction with said second direction being 90-degree perpendicular to said first direction and a first distance between two neighboring rings along said first direction being same as a second distance between two neighboring rings along said second direction; and applying said layer of copolymer covering said substrate comprises forming said layer of copolymer directly next to said inner sidewall and said outer sidewall of said set of rings.

2. The method of claim 1, wherein causing said copolymer to form said plurality of cylindrical blocks comprises forming only one cylindrical block inside each of said rings and only one cylindrical block outside every four (4) neighboring rings.

3. The method of claim 2, wherein said copolymer has a property of forming cylindrical blocks separated by a distance Cp in an unconstrained space, and wherein causing said copolymer to form only one cylindrical block inside each of said rings comprises forming said rings to have an inner diameter size larger than Cp but less than 2×Cp.

4. The method of claim 2, wherein said copolymer has a property of forming cylindrical blocks separated by a distance Cp in an unconstrained space, and wherein causing said copolymer to form only one cylindrical block outside every four (4) neighboring rings comprises forming said rings to have a distance between two diagonally neighboring rings larger than Cp but less than 2×Cp.

5. The method of claim 2, wherein said copolymer is polystyrene-block-polymethylmethacrylate (PS-b-PMMA) and in an unconstrained space forms cylindrical blocks separated by Cp, and wherein said Cp is designed according to an inner diameter size of said rings and a distance between two diagonally neighboring rings, by adjusting a ratio of PS versus PMMA in weight.

6. The method of claim 5, wherein said ratio of PS versus PMMA ranges from about 80:20 to about 60:40.

7. The method of claim 1, wherein forming said set of shapes comprises:
   forming a set of openings in a photo-resist material coated on said substrate;
   applying a layer of cross-link coating material covering said set of openings;
   causing said cross-link coating material to form said set of shapes along sidewalls of said set of openings; and
   removing said photo-resist material from said substrate.

8. The method of claim 7, further comprising exposing said cross-link coating material to a heated environment to cause said cross-link coating material to react with said sidewalls of said set of openings in forming said set of shapes, and removing un-reacted cross-link coating material through a developing process.

9. The method of claim 7, wherein said openings have a circular shape.

10. The method of claim 1, wherein forming said pattern of contact holes comprises subjecting said copolymer to a rinse process to create said contact holes in locations of said cylindrical blocks.

11. The method of claim 1, wherein said copolymer is selected from a group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

12. A method of forming a semiconductor structure, comprising:
   forming a set of rings on top of a substrate, said set of rings each having an inner sidewall and an outer sidewall;
   applying a layer of copolymer covering said substrate and covering said inner sidewall and said outer sidewall of said set of rings;
   causing said copolymer to form a plurality of cylindrical blocks both inside and outside said rings;
   forming a pattern of contact holes from said plurality of cylindrical blocks; and
   transferring said pattern of contact holes to said substrate to form said semiconductor structure,
   wherein said rings are equally spaced either horizontally or vertically with a distance between centers of two horizontally spaced neighboring rings of said rings being same as a distance between centers of two vertically spaced neighboring rings of said rings.

13. The method of claim 12, wherein causing said copolymer to form said plurality of cylindrical blocks comprises forming only one cylindrical block inside each of said rings and only one cylindrical block outside every four (4) neighboring rings in an area of square shape whose corners are defined by centers of said four neighboring rings.

14. The method of claim 13, wherein said copolymer has a property of forming cylindrical blocks separated by a distance Cp in an unconstrained space, and wherein causing said copolymer to form only one cylindrical block inside each of said rings comprises adjusting a weight ratio of components in said copolymer according to an inner diameter size of said rings.

15. The method of claim 13, wherein said copolymer has a property of forming cylindrical blocks separated by a distance Cp in an unconstrained space, and wherein causing said copolymer to form only one cylindrical block outside every four (4) neighboring rings comprises forming said rings to have a distance between two diagonally neighboring rings larger than Cp but less than 2×Cp.

16. The method of claim 13, wherein said copolymer is polystyrene-block-polymethylmethacrylate (PS-b-PMMA) and in an unconstrained space forms cylindrical blocks separated by Cp, and wherein said Cp is adjusted by adjusting a ratio of PS versus PMMA in weight.

17. The method of claim 16, wherein said ratio of PS versus PMMA ranges from about 80:20 to about 60:40.

18. The method of claim 12, wherein forming said set of rings comprises:
   forming a set of openings in a photo-resist material coated on said substrate;
   applying a layer of cross-link coating material covering said set of openings;
   causing said cross-link coating material to form said set of rings along sidewalls of said set of openings; and
   removing said photo-resist material from said substrate.

19. The method of claim 18, further comprising exposing said cross-link coating material to a heated environment to cause said cross-link coating material to react with said sidewalls of said set of openings in forming said set of rings, and removing un-reacted cross-link coating material through a developing process.

20. A method of forming a semiconductor structure, comprising:
   forming a set of shapes on top of a substrate;
   applying a layer of copolymer covering said substrate;
   causing said copolymer to form a plurality of cylindrical blocks both inside and outside said shapes;
   forming a pattern of contact holes from said plurality of cylindrical blocks; and
   transferring said pattern of contact holes to said substrate to form said semiconductor structure,
   wherein said shapes are equally spaced both horizontally and vertically.

21. The method of claim 20, wherein said set of shapes are a set of rings.

22. The method of claim 20, wherein causing said copolymer to form said plurality of cylindrical blocks comprises forming only one cylindrical block inside each of said shapes and only one cylindrical block outside every four (4) neighboring shapes.

23. The method of claim 22, wherein said copolymer has a property of forming cylindrical blocks separated by a distance Cp in an unconstrained space, and wherein causing said copolymer to form only one cylindrical block inside each of said shapes comprises forming said shapes to have a size larger than Cp but less than 2×Cp.

24. The method of claim 22, wherein said copolymer has a property of forming cylindrical blocks separated by a distance Cp in an unconstrained space, and wherein causing said copolymer to form only one cylindrical block outside every four (4) neighboring shapes comprises forming said rings to have a space in between said shapes larger than Cp but less than 2×Cp.

25. The method of claim 20, wherein forming said set of shapes comprises:
   forming a set of openings in a photo-resist material coated on said substrate;
   applying a layer of cross-link coating material covering said set of openings;
   causing said cross-link coating material to form said set of shapes along sidewalls of said set of openings; and
   removing said photo-resist material from said substrate.

26. The method of claim 25, further comprising exposing said cross-link coating material to a heated environment to cause said cross-link coating material to react with said sidewalls of said set of openings in forming said set of shapes.

27. The method of claim 25, wherein said openings have a circular shape.

28. The method of claim 20, wherein forming said pattern of contact holes comprises subjecting said copolymer to a rinse process to create said contact holes in locations of said plurality of cylindrical blocks.

29. The method of claim 12, wherein said plurality of cylindrical blocks are same in shape and size.

30. The method of claim 20, wherein said cylindrical blocks inside said set of shapes are same in shape and size as cylindrical blocks outside said set of shapes.

* * * * *